United States Patent
Maldo et al.

(10) Patent No.: US 11,315,856 B2
(45) Date of Patent: *Apr. 26, 2022

(54) LEADFRAME WITH SOCKETS FOR SOLDERLESS PINS

(71) Applicant: SEMICONDUCTOR COMPONENTS INDUSTRIES, LLC, Phoenix, AZ (US)

(72) Inventors: Tiburcio Maldo, Consolacion (PH); Keunhyuk Lee, Suzhou (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 8 days.

This patent is subject to a terminal disclaimer.

(21) Appl. No.: 16/947,317

(22) Filed: Jul. 28, 2020

(65) Prior Publication Data

US 2020/0365493 A1    Nov. 19, 2020

Related U.S. Application Data

(62) Division of application No. 15/939,632, filed on Mar. 29, 2018, now Pat. No. 10,741,480.

(51) Int. Cl.
| | |
|---|---|
| *H01L 23/495* | (2006.01) |
| *H01R 12/58* | (2011.01) |
| *H01L 23/31* | (2006.01) |
| *H01L 21/56* | (2006.01) |

(52) U.S. Cl.
CPC .... *H01L 23/49541* (2013.01); *H01L 23/3107* (2013.01); *H01R 12/585* (2013.01); *H01L 21/565* (2013.01)

(58) Field of Classification Search
CPC ........... H01L 23/49541; H01L 23/3107; H01L 21/565; H01L 21/4882; H01L 23/40; H01L 23/3114; H01L 23/49537; H01L 23/495; H01L 23/49503; H01L 23/4952
See application file for complete search history.

(56) References Cited

U.S. PATENT DOCUMENTS

| | | | |
|---|---|---|---|
| 9,263,820 B2 | 2/2016 | Mattiuzzo | |
| 10,741,480 B2 * | 8/2020 | Maldo | ............... H01L 23/49541 |
| 2017/0200666 A1 | 7/2017 | Hable et al. | |

* cited by examiner

*Primary Examiner* — Thanh Y. Tran
(74) *Attorney, Agent, or Firm* — Brake Hughes Bellermann LLP

(57) ABSTRACT

In a general aspect, a method can include coupling a semiconductor component to a leadframe. The leadframe can include a socket member having a first end portion and a second end portion. The socket member can further include an opening disposed between the first end portion and the second end portion. The opening of the socket member can be configured to receive a solderless pin. The method can also include encapsulating, in a molding compound, at least a portion of the leadframe and at least a portion of the semiconductor component such that the opening of the socket member is exposed through the molding compound.

20 Claims, 12 Drawing Sheets

LEADFRAME WITH SOCKETS FOR SOLDERLESS PINS

CROSS-REFERENCE TO RELATED APPLICATION

This application is a divisional of U.S. application Ser. No. 15/939,632, filed Mar. 29, 2018, which is incorporated by reference herein in its entirety.

TECHNICAL FIELD

This description relates to leadframes for use in semiconductor package modules.

BACKGROUND

A leadframe is a thin layer of metal to which semiconductor chips are attached during assembly of a package module. To address the problem of cold soldering of package pins to an external component such as a printed circuit board (PCB), conventional semiconductor package assemblies can have leadframes that include pins. Such pins can be used to interface with an external component such as a PCB.

SUMMARY

In a general aspect, a method can include coupling a semiconductor component to a leadframe. The leadframe can include a socket member having a first end portion and a second end portion. The socket member can further include an opening disposed between the first end portion and the second end portion. The opening of the socket member can be configured to receive a solderless pin. The method can also include encapsulating, in a molding compound, at least a portion of the leadframe and at least a portion of the semiconductor component such that the opening of the socket member is exposed through the molding compound.

The details of one or more implementations are set forth in the accompanying drawings and the description below. Other features will be apparent from the description and drawings, and from the claims.

DETAILED DESCRIPTION

The implementations described herein can include an improved semiconductor package assembly including a leadframe that includes a socket member into which solderless pins may be inserted as interconnects to an external component. The cost of manufacturing such a leadframe is reduced without sacrificing the ability to make solderless connections with external components such as printed circuit boards (PCBs). For example, instead of using a relatively hard material that requires two stamping tools, the leadframes with sockets (e.g., female sockets, openings) may be made using softer copper-based materials. Moreover, the overall width of such leadframes is significantly smaller than the width of a leadframe with the press-fit pins included. Such a reduced width may further reduce manufacturing costs.

The package assembly configurations described herein are advantageous over semiconductor package assemblies that use of hard materials in leadframes in order for pins in such a leadframe to withstand forces during an insertion process. The package assembly configurations described herein can avoid coil-set and lead co-planarity issue that may be problematic in semiconductor package assemblies that use relatively hard materials in leadframes. The processes for manufacturing the package assemblies described herein can also eliminate the use two stamping tools: one that produces the leadframe and another to correct coil-set and lead co-planarity issue.

Figure 1A:
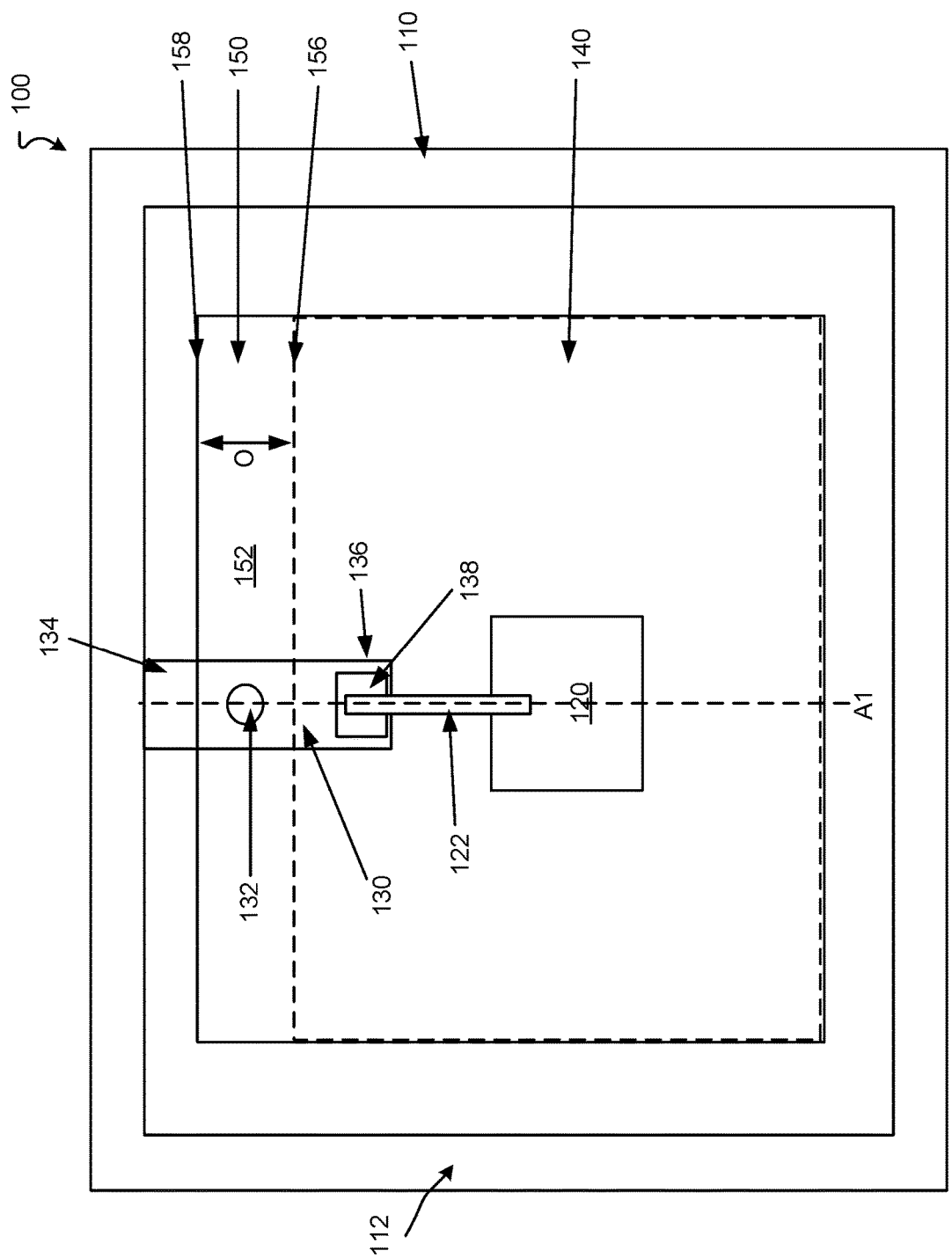
FIG. 1A is a diagram that illustrates a top view of an example package assembly including a leadframe having a socket member.

FIG. 1A is a diagram that illustrates a top view of an example package assembly 100. The package assembly 100 includes a leadframe 110, a semiconductor component 120, an interconnect 122 between the semiconductor component 120 and the leadframe 110, a top molding portion 140, and a bottom molding portion 150. The leadframe 110 is configured to provide an electrical connection between the semiconductor component 120 and a component external to the package assembly 100, for example a PCB. The top molding portion 140 is illustrated with a dashed line so that the components included in the package assembly 100 can be readily shown. The top molding portion 140 is disposed above (in a direction out of the page) the bottom molding portion 150 (in a direction into the page).

As shown in FIG. 1A, the leadframe 110 includes an perimeter portion 112 and a socket member 130. The perimeter portion 112 defines a perimeter of the leadframe 110.

The perimeter portion 112, in some implementations, is removed during an assembly process from the package assembly 100 and separated from the socket member 130.

The socket member 130 of the leadframe 110 is connected to the perimeter portion 112 of the leadframe 110 at a first end portion 134 of the socket member 130. The socket member 130 is configured to provide an electrical connection between the semiconductor component 120 via an interconnect 122 and a solderless pin that connects the leadframe 110 to an external component. The socket member 130 can be configured to provide an electrical connection to the semiconductor component 120 over a bond area 138 disposed at a second end portion 136 of the socket member 130. The first end portion 134 is on an opposite end of the socket member 130 related to the second end portion 136.

The socket member 130 also includes an opening 132 that is disposed between the first end portion 134 and the second end portion 136. The opening 132 is configured to receive a solderless pin (not shown in FIG. 1A). In some implementations, the pin can be, for example a press-fit pin. Advantageously, the leadframe 110 that includes the socket member 130 having the opening 132 may have a width significantly smaller than a conventional leadframe. Such a smaller width also contributes to the manufacture of a less expensive semiconductor package assembly. More details related to the width are described in connection with at least FIG. 2A.

As shown in FIG. 1A, the opening 132 included in the socket member 130 is circular. In some implementations, the opening 132 may have a different shape such as a square, rectangle, ellipse, or any shape configured to receive a particular solderless connector.

The top molding portion 140 and the bottom molding portion 150 form a molding that at least partially surrounds the leadframe 110 and houses the semiconductor component 120. The top molding portion 140 is offset by a distance O from the bottom molding portion 150 to define a recessed area 152 on the bottom molding portion 150. The recessed area 152 is disposed between (e.g., defined by) an edge 156 of the top molding portion 140 and an edge 158 of the bottom molding portion. The opening 132 of the socket member 130 is disposed within the recessed area 152. Specifically, the opening 132 of the socket member 130 is exposed within the recessed area 152. Also, at least a portion of (e.g., a surface of) the socket member 130 is exposed within the recessed area 152.

Figure 1B:
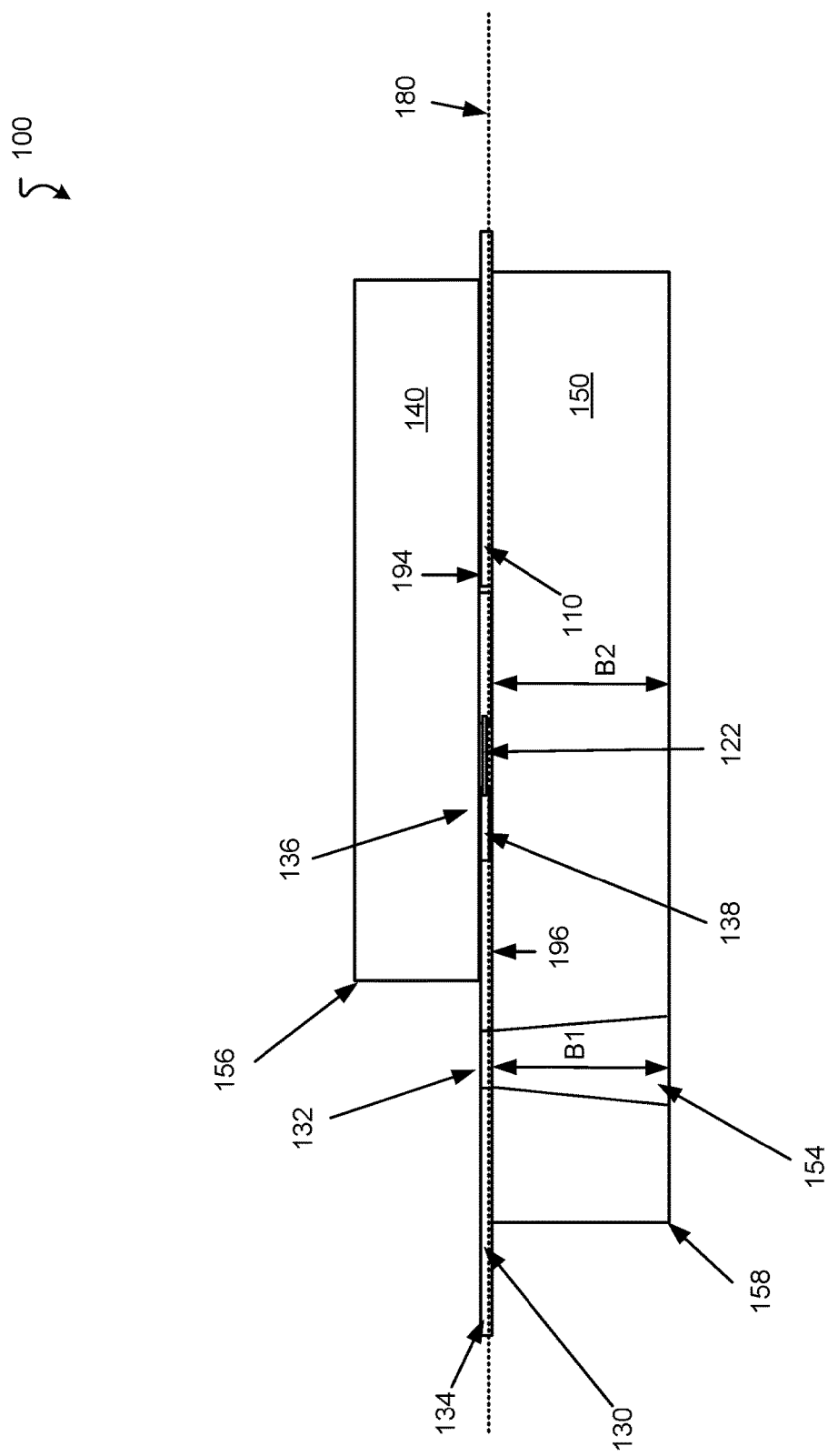
FIG. 1B is a diagram that illustrates a side view of the example package assembly including the leadframe having the socket member.

FIG. 1B is a diagram that illustrates a side view of the example package assembly 100 cut along line A1 in FIG. 1A. FIG. 1B illustrates the package assembly without the perimeter portion 112 of the leadframe 110. FIG. 1B shows the leadframe 110 disposed within a plane 180. The top molding portion 140 is disposed on one side of the plane 180 and the bottom molding portion 150 is disposed on the opposite side of the plane 180. As shown in FIG. 1B, the opening 132 of the socket member 130 is disposed within the recessed area 152.

In this implementation, sidewalls that define the edges 156 and 158 of the top molding portion 140 and the bottom molding portion 150 are perpendicular to the plane 180. In some implementations, the sidewalls of the edges 156 and 158 are not normal to the plane 180. In this implementation, the edge 156 of the top molding portion 140 is aligned parallel to the edge 158 of the bottom molding portion 150. In some implementations, the edge 156 is non-parallel to the edge 158.

In some implementations, the top molding portion 140 has a surface 194 in contact with (e.g., adjacent to) a first side of the leadframe 110 and the bottom molding portion 150 has a surface 196 in contact with (e.g., adjacent to) a second side of the leadframe. As shown in FIG. 1B, the plane 180 is parallel to the surfaces 194 and 196 and the surface 194 is parallel to the surface 196. In some implementations, the plane 180 is not parallel to the surface 194 and/or the surface 196.

As shown in FIG. 1A, a hole 154 is defined within the bottom molding portion 150. The hole 154 is in fluid communication with the opening 132. The hole 154 is configured to receive (or engage) a solderless connector such as a press-fit pin. In this implementation, the wall (e.g., sidewall) of the hole 154 is sloped so that a diameter of the hole 154 at a bottom of the hole is larger than a diameter of the opening 132.

For example, a solderless connector can have an end that is compressed as it engages with the opening 132 and expands into the tapered hole 154 as the end of the solderless connector is moved (e.g., pushed) through the opening 132 and into the tapered hole 154. Because the tapered hole 154 has a sloped sidewall, the expanded end of the solderless connector can engage with the sloped sidewall and the biasing of the end of the solderless connector can help prevent the solderless connector from being moved out of the hole 154 and through the opening 132 in an undesirable fashion. More details regarding tapered holes such as hole 154 are discussed with respect to at least FIG. 3C.

Although the opening 132 is shown in FIG. 1A as having a circular shape, the opening 132 can be another shape. In some implementations, a cross section of the hole 154 can be a non-circular shape. In some implementations, the hole 154 may have a cross-section that is a square shape, a rectangular shape, or an elliptical shape.

Although not shown in FIG. 1B, in some implementations, the hole 154 may have a cylindrical shape with a uniform cross-section through the depth of the hole. In some implementations, the hole 154 may have a cross-sectional area that decreases rather than increases with distance from the opening 132. In some implementations, the shape of the hole 154 may be optimized to best engage with a shape of a particular solderless contact.

As shown in FIG. 1B, the hole 154 has a length B1 that corresponds with (e.g., is equal to) a thickness B2 of the bottom molding portion 150. In some implementations, the hole 154 can have the length B1 of the hole 154 can be less than the thickness B2 of the bottom molding portion 150. In such implementations, the bottom molding portion 150 may not have a hole therethrough. Instead the bottom molding portion 150 can have a recess (e.g., a cavity) that is disposed below and in fluid communication with the opening 132.

As shown in FIG. 1B, the first end portion 134 of the socket member 130 extends beyond the edge 158 of the bottom molding portion 150. As mentioned above, prior to completion of the package assembly 100, the perimeter portion 112 (shown in FIG. 1A) is removed and the socket member 130 remains part of the package assembly 100. In some implementations, the socket member 130 extends beyond (e.g., is cantilevered beyond, has a portion that extends beyond or overhangs) the edge 158 even after removal of the perimeter portion 112 of the leadframe 110. In some implementations, the socket member 130 does not extend beyond the edge 158 after removal of the perimeter portion 112 of the leadframe 110. In such implementations, the socket member 130 can be cut so that an end surface of the socket member 130 is aligned with at least a portion of a sidewall associated with, for example, the edge 158.

In some implementations, the leadframe 110 can be manufactured using a relatively soft copper material. Advantageously, the use of such a soft copper material can eliminate or reduce a leadframe coil set issue. The elimination of the leadframe coil set issue allows for the leadframe 110 to be made using a single stamping tool rather than two stamping tools used to make leadframes in conventional semiconductor package assemblies. The result is that the leadframe 110 and leadframes that use a soft copper material contribute to a less expensive semiconductor package assembly.

Figure 2A:
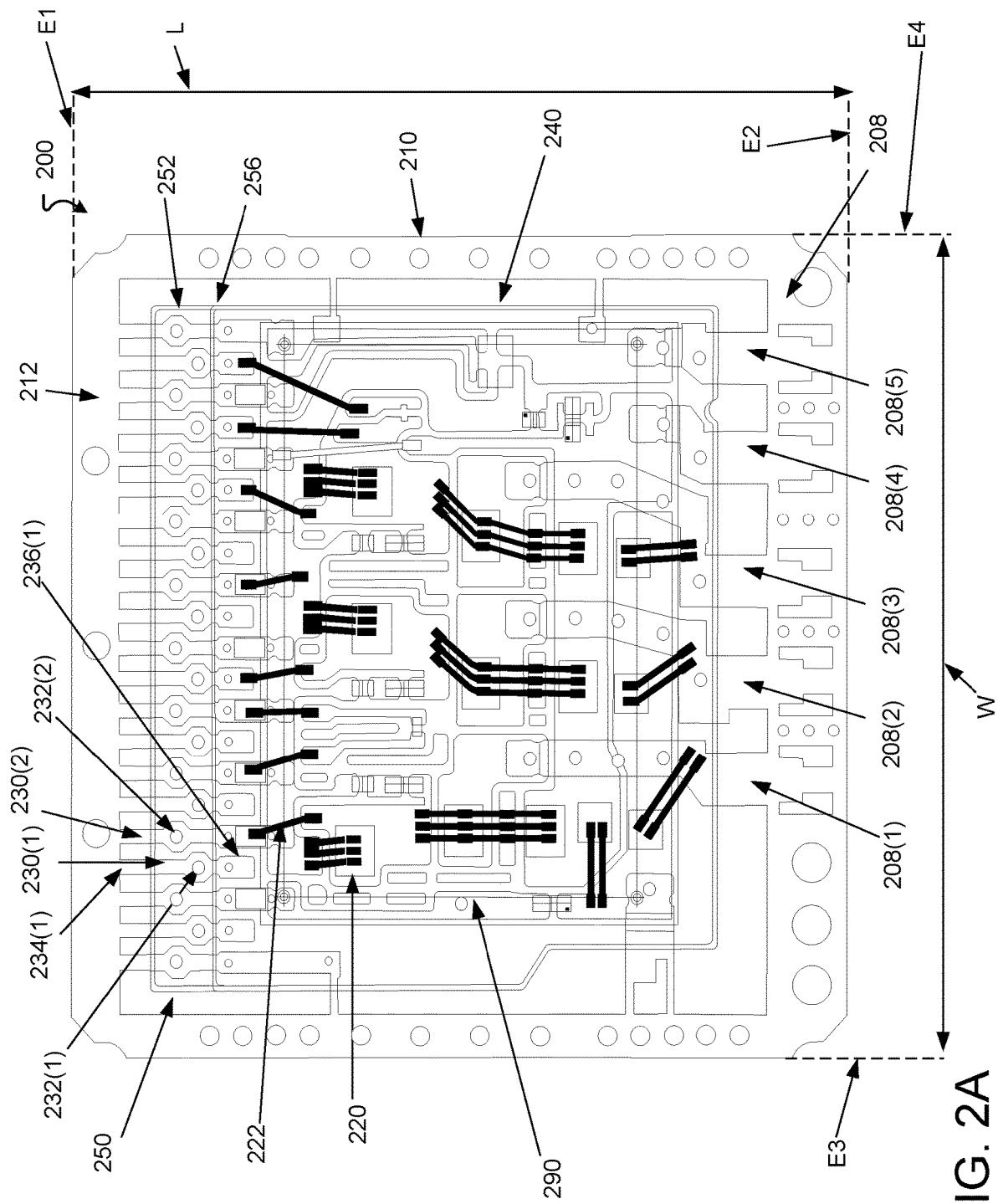
FIG. 2A is a diagram that illustrates a top view of the leadframe of the example package assembly with an outline of a molding of the package assembly shown.

FIG. 2A is a diagram that illustrates a diagram of a semiconductor package assembly 200. This package assembly can be an example of the package assembly 100 shown in FIGS. 1A and 1B. This diagram illustrates an outline of a top molding portion 240 and a bottom molding portion 250 of the semiconductor package assembly 200. As shown in FIG. 2A, the semiconductor package assembly 200 includes a substrate 290 onto which a semiconductor component 220 is bonded.

Figure 2B:
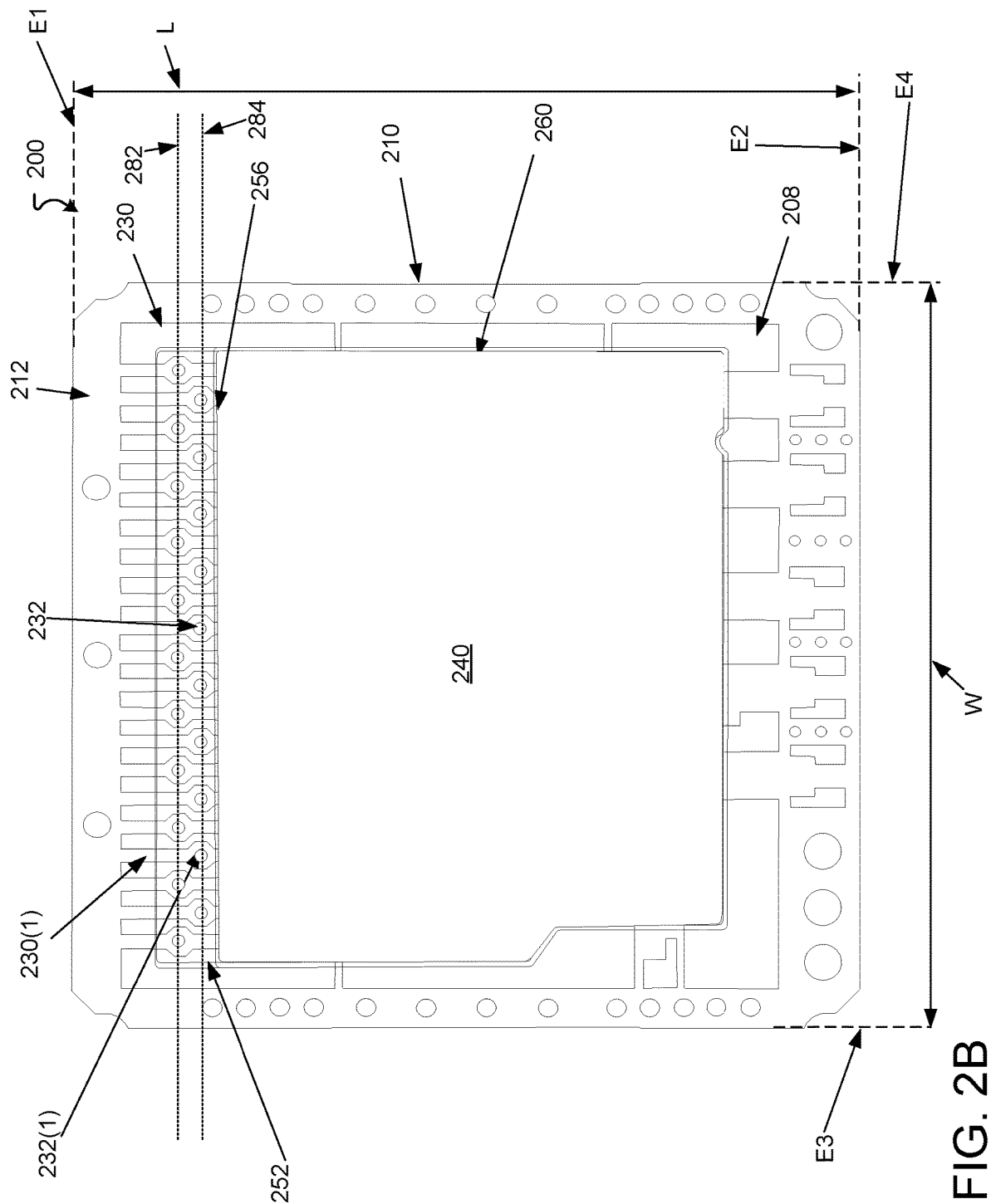
FIG. 2B is a diagram that illustrates a top view of the leadframe of the example package assembly with the molding of the package assembly shown.

As shown in FIG. 2A, the leadframe 210 is shown with multiple socket members 230 attached to a perimeter 212 of the leadframe 210, the socket members 230 including socket member 230(1) and socket member 230(2). The socket members 230 have opening 232 including opening 232(1) and 232(2). The socket members 230 are arranged in an alternating pattern, with the socket member 230(1) having the opening 232(1) at a first distance from the edge 256 of the top molding member. The socket member 230(2) (e.g., an adjacent socket member 230(2)) has the opening 232(2) at a second distance from the edge 256. As shown in FIG. 2B, the second distance is greater than the first distance. The arrangement of the socket members 230 as shown in FIG. 2B increases the density of openings within the recessed area 252.

Accordingly, the leadframe 110 that includes the socket member 130 having the opening 132 may have a length significantly smaller than a conventional leadframe. In the context of leadframe 210, a length may refer to a distance L, between edges E1 and E2 of the perimeter 212 of the leadframe 210, in the plane 180 (FIG. 1B) in a direction perpendicular to the edge 256. For example, a conventional leadframe has connectors (e.g., connectors with a single solderless end) fixedly attached to its perimeter. Such connectors can have a length. In a conventional leadframe, the length conventional leadframe should be long enough to include these connectors. In contrast, it has been found that the length L of the leadframe 210 having the sockets 230 attached to the perimeter 212 may be substantially smaller (e.g., 30% smaller) than the length of a conventional leadframe.

The leadframe 210 may also have a width W, between edges E3 and E4 of the perimeter 212 of the leadframe 210, that is smaller than that of the conventional leadframe. At least one factor resulting in reducing the width W of the leadframe 210 with respect to the conventional leadframe is the arrangement of the sockets 230 within the recessed area 252. Such an arrangement shown in FIG. 2A with alternating openings depends on the geometry of the sockets 230, which is discussed in further detail with respect to FIG. 3C.

In some implementations, the openings of the socket members 230 may be arranged in a different pattern than shown in FIG. 2A. In some implementations, the openings (e.g., 232(1) and 232(2)) may be arranged at the same distance from the edge 256. In some implementations, each of the openings of the socket members 230 may have different distances from the edge 256.

In this implementation, the leadframe 210 is disposed within a plane (as was the leadframe 110 shown in FIG. 1B). In some implementations, the socket members 230 may not each be disposed within the same plane (e.g., may not all be coplanar). For example, the recessed area 252 may have a non-uniform topography. In such implementations, the recessed area 252 may have a slope or may have some surface non-uniformity (e.g., roughness). Accordingly, in some implementations, the socket members 230 and consequently the openings (e.g., openings 232(1) and 232(2)) may not be confined to a single plane.

Also shown in FIG. 2A are interconnects 222 that are configured to provide an electrical connection between the semiconductor components (e.g., semiconductor component 220) and socket members 230 (e.g., a second end portion 236(1) of a socket member 230(1)). Also shown in FIG. 2A are a set of pins 208 as part of the leadframe 210. The pins 208 may function (e.g., serve) as input pins to other circuitry that provides power to the assembly 200. In some implementations, the pins 208(1), 208(2), and 208(3) are, respectively, a U-phase pin, a V-phase pin, and a W-phase pin that direct current to a three-phase motor controlled by circuitry within the assembly 200. In some implementations, the pins 208(4) and 208(5) function, respectively, as a source of differential current. In some implementations, at least one of the pins 208 can function as a connection to ground.

FIG. 2B is a diagram that illustrates a top view of the semiconductor package assembly 200 with the top molding portion 240 shown as opaque. Again, the openings 232 of each of the multiple socket members 230 are disposed within the recessed area 152. In this way, solderless connectors may be inserted into each of the openings.

As shown in FIG. 2B, each of the openings 232 are disposed on one of line 282 and line 284. The lines 282 and 284, as shown, are both parallel to each other and the edge 256 of the top molding portion. Nevertheless, the placement of the openings 232 as shown in FIG. 2B is by no means a requirement. Alternatively, in some implementations, one or both of the lines 282 and 284 may be skewed with respect to the edge 256. In some implementations, one of the lines 282 and 284 may be parallel with the edge 256 and the other skewed with respect to the edge 256.

In some implementations, the openings 232 do not lie on a pair of lines but rather more than two lines. In some implementations, the lines are parallel with the edge 256 and the openings 232 are disposed at any of more than two distances from the edge 256. For example, when there are three lines, the openings 232 may be disposed at any of three distances from the edge 256. In some implementations, one or both of the lines 282 and 284 are each instead line segments having different slopes over the recessed area 252. For example, the line 282 may instead be a "V" shape, a "W" shape, or the like. In some implementations, the openings 232 may not be aligned along a line but can be aligned along one or more curves. For example, such a curve may take the form of a circular arc, an elliptical arc, a parabolic arc, or piecewise sections of such curves.

Figure 3A:
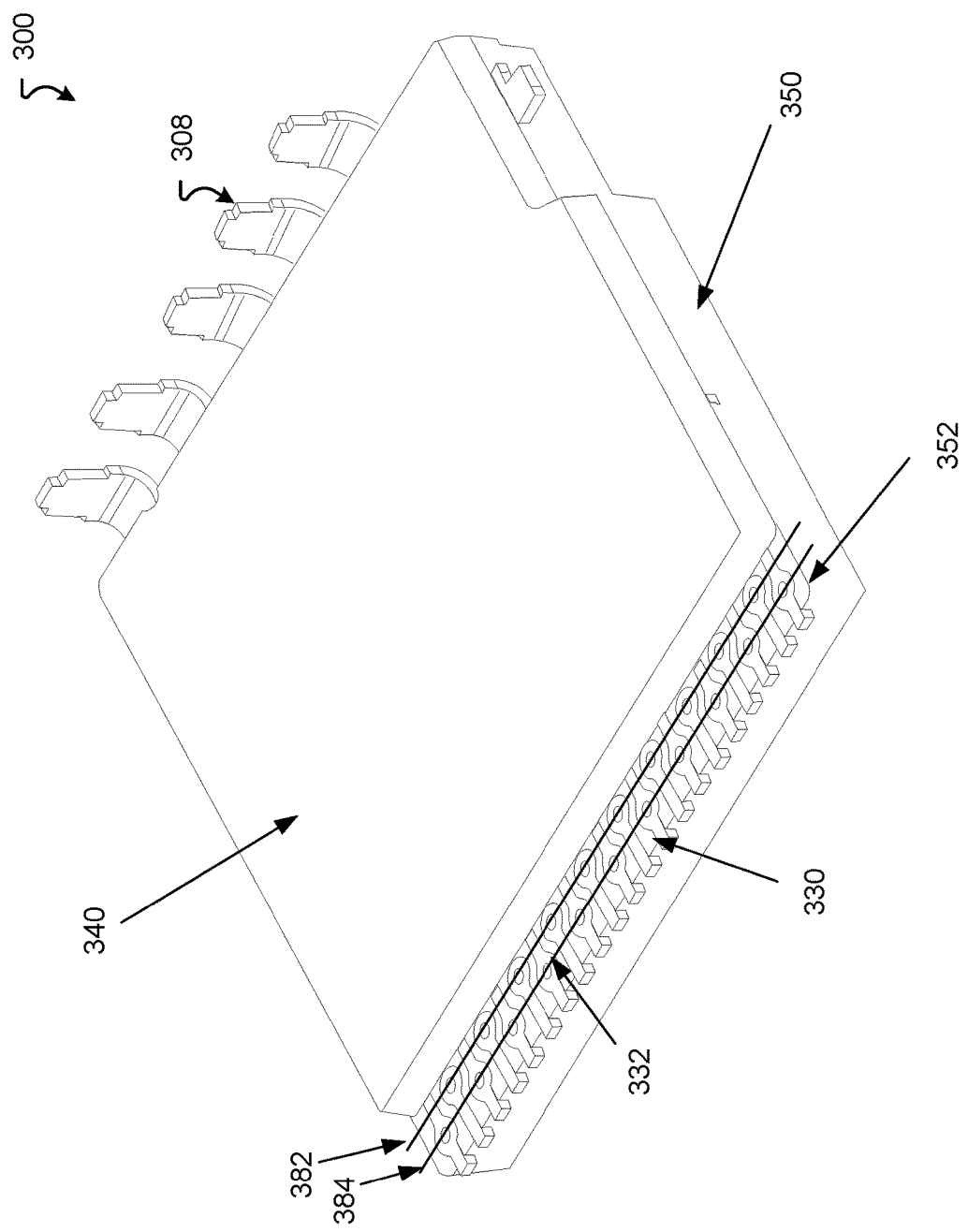
FIG. 3A is a diagram that illustrates a perspective view of an example package assembly with the openings of the socket members of the leadframe visible in a recessed area disposed on the bottom molding portion.

FIG. 3A is a diagram that illustrates a perspective view of an example semiconductor package assembly 300 that is a variation of the package assembly shown in at least FIGS. 1A and 1B. As with the semiconductor package assembly 200 in FIGS. 2A and 2B, the semiconductor package assembly 300 has multiple socket members 330 each having respective openings 332 disposed within a recessed area 352 of a bottom molding portion 350 and outside of a top molding portion 340.

As shown in FIG. 3A, the socket members 330 are arranged in the recessed area 352 so as to include many openings within the recessed area 352. The sockets 330 as shown in FIG. 3A are arranged in a similar manner as the sockets 230 shown in FIGS. 2A and 2B, such that the openings 332 are aligned along one of two lines 382 and 384 that are parallel to each other and the edge 356 of the top molding portion 340. In some implementations, the openings 332 may not be aligned along the lines 382 and 384 but in some other arrangement as described above with regard to FIG. 2B.

Further, as shown in FIG. 3A, the assembly 300 includes a set of pins 308 analogous to the pins 208 shown in FIGS. 2A and 2B. The set of pins 308 are shown in a bent (e.g., curved) configuration. Such a configuration facilitates a connection with a device such as a three-phase motor.

The top molding portion 340 and the bottom molding portion 350 form a part of the assembly 300 that protects the semiconductor devices (not shown) (e.g., components 220 attached to the substrate 290 in FIG. 2A). As will be shown in further detail with regard to FIGS. 4A, 4B, 5A and 5B, each of the top molding portion 340 and the bottom molding portion 350 may be made using an injection molding process. In this case, the top molding portion 340 and the bottom molding portion 350 are made from a plastic material suitable for such an injection molding process that can withstand heat generated during operation of the assembly 300. For example, the plastic used to make the top molding portion 340 and the bottom molding portion 350 may be a thermoplastic material. Nevertheless, the assembly 300 may be made by a process other than a thermoplastic injection molding. For example, in some implementations, the top molding portion 340 and the bottom molding portion 350 may be made using an epoxy transfer molding, which uses moderate pressures to transfer B-stage epoxy into a hot mold where it cures to a solid.

Figure 3B:
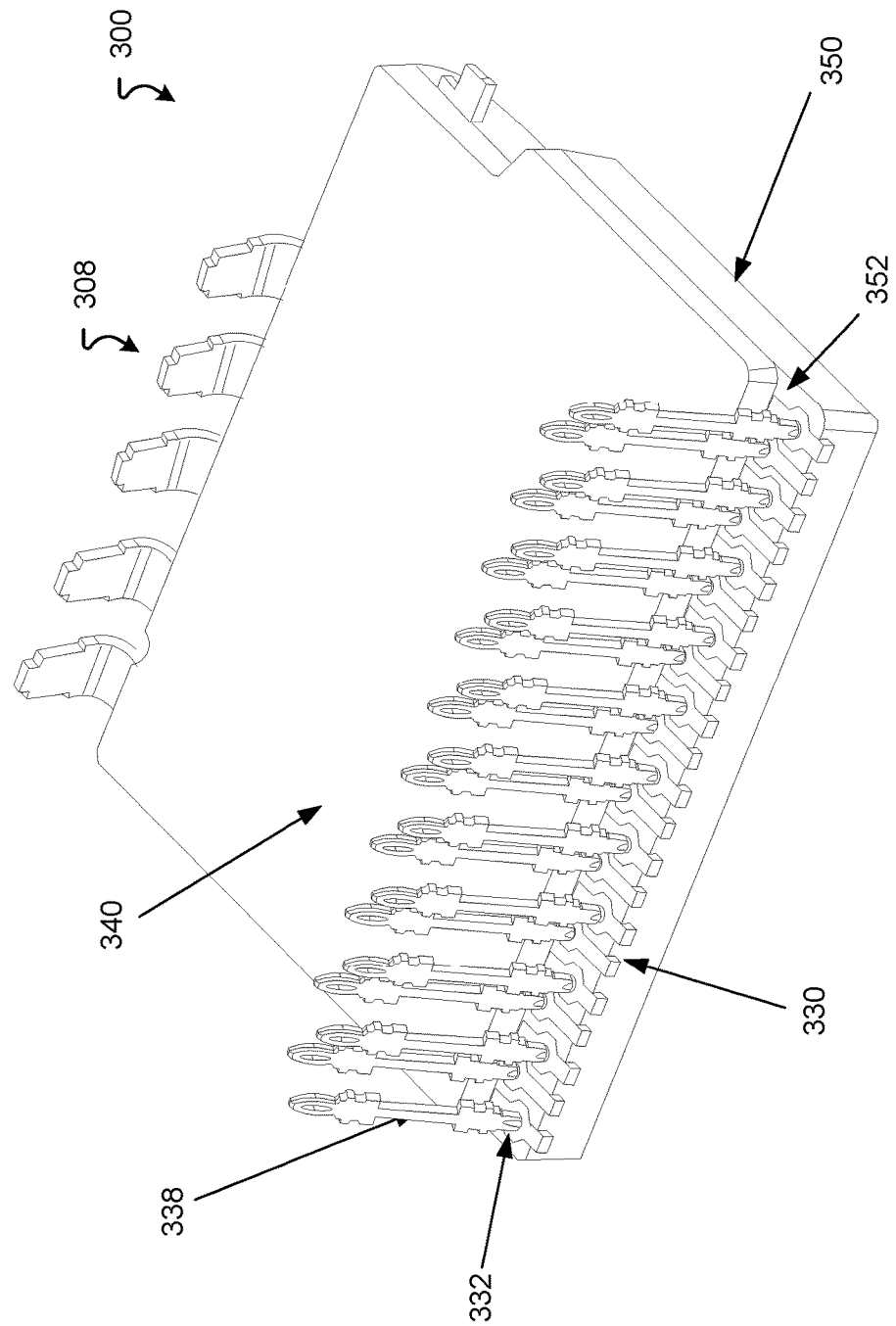
FIG. 3B is a diagram that illustrates the perspective view of the example package assembly with press-fit pins inserted into the openings of the socket members of the leadframe.

FIG. 3B is a diagram that illustrates the perspective view of the semiconductor package assembly 300 shown in FIG. 3A, but with solderless connectors 338 inserted into the openings 332 of the socket members 330. As shown in FIG. 3B, the solderless connectors 338 have ends that are configured to create a rigid connection with the assembly 300 using the openings 332 of the socket members 330. The rigid connections are a result of the design of the openings 332 and the ends of the solderless pins 338.

In some implementations, the solderless connectors 338 are press-fit pins. The press-fit pins 338 have ends that are compliant so that they expand into a hole beneath an opening 332. In some implementations, a press-fit pin has an end with a slot in an elastic material that allows the pin end to expand and contact the walls of the hole beneath the opening 332 when the press-fit pin 338 is pressed into the hole 332. Accordingly, the press-fit pin 338 experiences a spring-like force at its end in response to a force pressing the pin into the hole 332 that results in the part of the pin inserted into the hole 332 to expand and provide desirable (e.g., maximum) contact with the hole below the opening 332. The press-fit pin experiences a similar force on its other end when pressed into an opening in an external component such as a PCB.

Figure 3C:
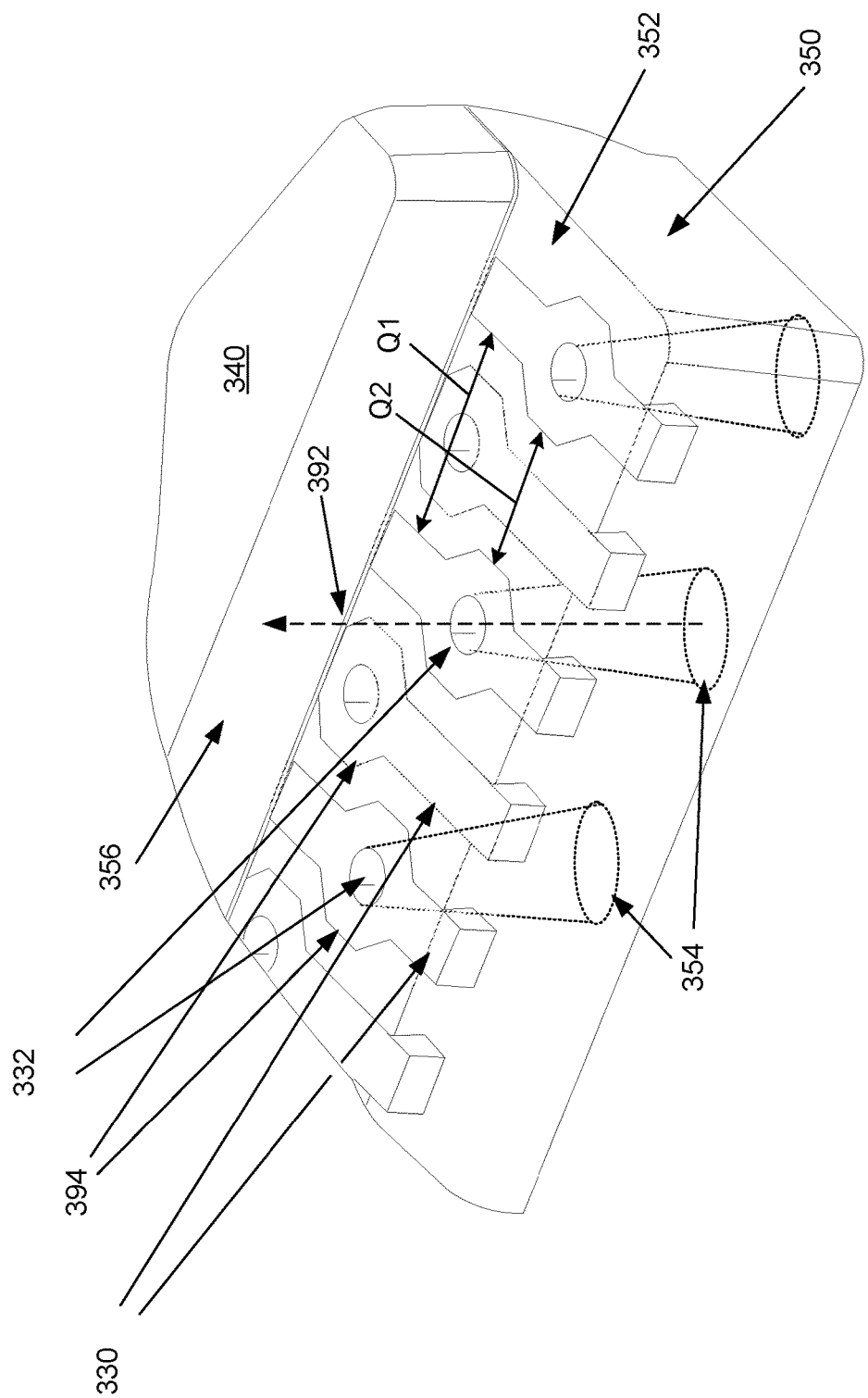
FIG. 3C is a diagram that illustrates a perspective view of a portion of a package assembly having tapered holes in the bottom molding portion in fluid communication with openings of the socket members of the leadframe.

FIG. 3C is a diagram that illustrates a close-up perspective view of a portion of the semiconductor package assembly 300 shown in FIG. 3A. As shown in FIG. 3C, the semiconductor package assembly 300 has tapered holes 354 in the bottom molding portion 350 that are configured to hold (e.g., maintain) an end of a solderless connector (e.g., the connector 338 shown in FIG. 3B) in place. The tapered holes 310 are in fluid communication with openings 332 of the socket members 330 of the leadframe 310. The tapered holes 310, in response to the openings 332 receiving respective solderless connectors (e.g., solderless connectors 210 in FIG. 2B), conform to the shape of the solderless connectors 210 in order to provide a robust physical and electrical connection between the socket members 230 and the solderless connectors 210.

As shown in FIG. 3C, each of the socket members 330 has a uniform profile except in the vicinity of the respective opening 332. Specifically, each socket member 330 has a bulge 394 that surrounds the respective opening 332. The purpose of such a shape for each of the socket members 330 is to allow a greater density of openings 332 in the recessed area 352 than would be available had each socket member 330 been of a uniform size throughout, even in the vicinity of the opening. That is, away from the respective opening 332, a socket member 330 has a narrower profile than in the vicinity of the opening 332.

The bulge 394 surrounding an opening 332 ensures that electrical contact will be made between a solderless connector and the respective socket member 330 when the solderless connector is inserted into the opening 332. For example, if there were no bulge 394 surrounding the opening 332, then there would be little to no metal (e.g., copper) contact and accordingly little to no electrical contact with the solderless connector. If there were no bulge but sufficient metal surrounding the hole to form an electrical contact with a solderless connector (e.g., a socket member 330 has a uniform width that is as large as the bulge 394 as shown in FIG. 3C), then there would be far fewer socket members 330 that could fit within the recessed area 352. As shown in FIG. 3C, a bulge 394 of a first of the socket members 330 is disposed within a width Q1 between narrow portions of a second and third of the socket members 330. Also, a narrow portion of the first of the socket members 330 is disposed within a width Q2 between bulges 394 of the second and third of the socket members 330.

As shown in FIG. 3C, the bulge 394 has an octagonal profile surrounding the opening 332. The octagonal profile can provide a large metal area surrounding the opening 332 without using a complex stamping process. In some implementations, the bulge 394 may have a hexagonal profile, a square profile, a decagonal profile, or any regular polygonal profile that may be made using the above-described stamping process and that provides sufficient electrical contact with a solderless connector inserted into that opening 332.

As shown in FIG. 3C, the opening 332 of the socket member 330 has a circular shape. As mentioned previously, the opening 332 can have a square, rectangular, or elliptical shape. In some implementations, the bulge 394 surrounding a non-circular opening 332 may have a profile that depends on the shape of that opening 332. For example, the bulge 394 may have a non-regular polygonal profile (e.g., a non-regular octagon, a non-regular heptagon, and the like). In some implementations, the shape of such a bulge 394 depends on the shape of the opening 332. For example, an elliptical hole 332 may have a bulge 394 that has an octagonal shape having a similar eccentricity as the elliptical hole 332. In this context, eccentricity can refer to a ratio of minor to major axis which may be defined for both an ellipse and a non-regular polygon.

The holes 354 as shown in FIG. 3C have a circular cross-section and the openings 332 have a circular shape.

Nevertheless, as discussed above with regard to FIG. 1B, the openings 332 and the cross sections of the holes 354 may not have a circular shape. The openings 332 and the holes 354 may be configured to improve (e.g., optimize) electrical contact with the solderless connectors 338. In some implementations, improving electrical contact can include improving surface area of contact between the end of the solderless connector 338 and the wall of the hole 354.

In some implementations, the holes 354 have a depth that reaches to the surface of the bottom molding portion 350 below the openings 330. In some implementations, the holes 354 all have the same depth. In some implementations, one or more of the holes 354 can have a different depth. For example, in some implementations, the holes 354 can have a depth based on the distance of the respective openings 332 from the edge 356 of the top molding portion 340.

As noted above, the holes 354 are in fluid communication with respective openings 332. In this context, fluid communication means that the openings 332 are aligned with respective holes 354 and that an opening 332 is congruent with the cross section of the hole 354 at the top of the hole. In some implementations, when each hole 354 and each respective opening 332 has an axis of symmetry, the axes of symmetry of coincident. Such a common axis of symmetry 392 for both opening 332 and hole 354 is shown in FIG. 3C. In some implementations, the axes of symmetry of the openings 332 and the holes 354 do not coincide.

The holes 354 shown in FIG. 3C are in fluid communication with the openings 332 closer to the first end portions of the socket members 330. The openings 332 that are further from the first end portions are in fluid communication with corresponding holes 354 as well, although those holes 354 are not shown in FIG. 3C.

Figure 4A:
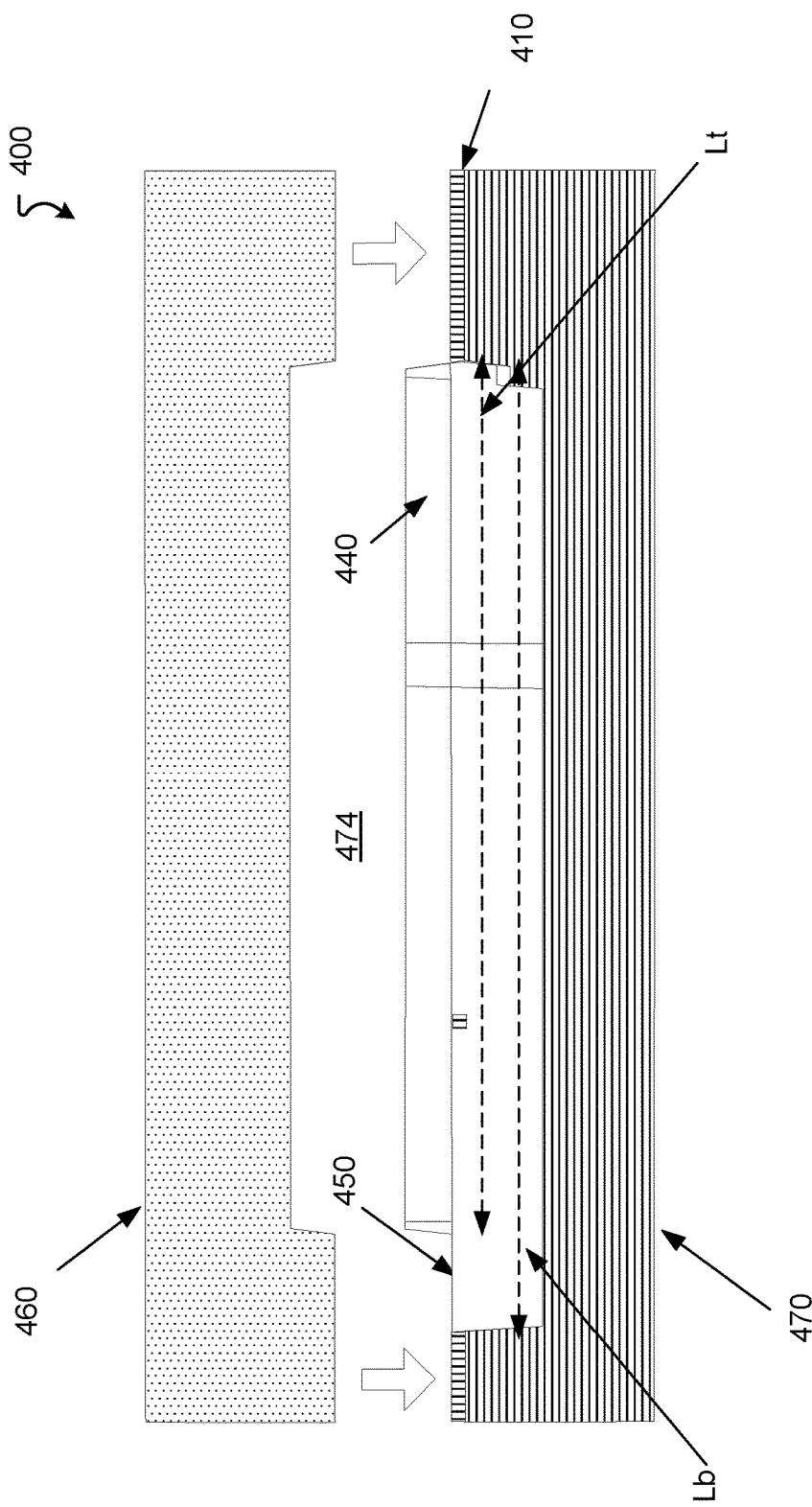
FIG. 4A is a diagram that illustrates example separated top and bottom mold members that are configured to produce the top and bottom moldings surrounding the leadframe using an injection molding process.

FIG. 4A is a diagram that illustrates example apparatus 400 for making a semiconductor package assembly. The apparatus 400 includes a top mold member 460 and a bottom mold member 470 which together are configured to produce the top and bottom molding portions 440 and 450, respectively, surrounding a leadframe 410. In some implementations, the top mold member 460 and the bottom mold member 470 are configured to facilitate an injection molding process that creates the top molding portion 440 and the bottom molding portion 450 surrounding the leadframe 410.

As shown in FIG. 4A, the top mold member 460 is shaped so that the injection molding process results in the top molding portion 440 having a shortened length Lt than a length Lb of the bottom molding member 470. It is this difference in lengths that produces the recessed area 452 onto which the openings 432 of the socket members 430 are disposed.

As noted above, in some implementations the injection molding process is a thermoplastic injection molding process. In this case, the top and bottom molding portions 440 and 450 are made from a thermoplastic material that may withstand the heat of operation of the resulting assembly. In some implementations, a different injection molding process may be used to make the top and bottom molding portions 440 and 450. For example, in some implementations, the apparatus 400 is configured to perform an epoxy transfer molding operation as described above with regard to FIG. 3A.

The process of making the semiconductor package assembly 402 can begin with injecting molding material (e.g., the thermoplastic or epoxy) into the cavity 474 between the top and bottom mold members 460 and 470. The injection molding material may be initially in a liquid state or a solid state. When in the solid state, the injection molding material will need to be melted. The top and bottom mold members 460 and 470 are brought together around the leadframe 410, immersing the leadframe 410 and the components attached to the leadframe 410 in the injection molding material. The scenario in which the top molding portion 440 and the bottom molding portion 450 are pressed together is shown with regard to FIG. 4B.

Figure 4B:
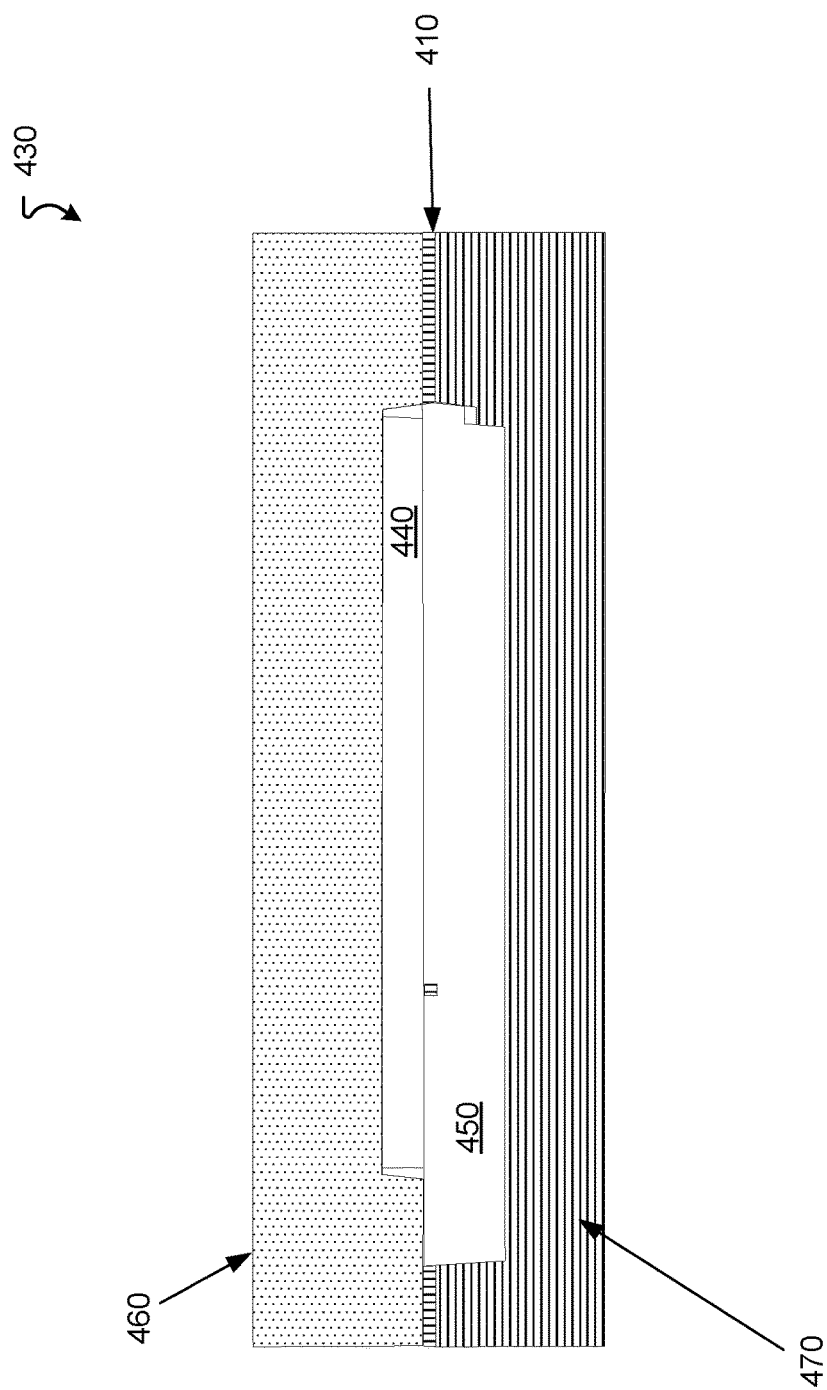
FIG. 4B is a diagram that illustrates example pressed-together top and bottom mold members that are configured to produce the top and bottom moldings surrounding the leadframe using an injection molding process.

FIG. 4B is a diagram that illustrates the example semiconductor package assembly 430 within the pressed-together top and bottom mold members 460 and 470, respectively. As shown in FIG. 4B, the top and bottom mold members 460 and 470 are aligned with respect to the leadframe 410 and are disposed on either side of the leadframe 410. Once the top and bottom mold members 460 and 470 are in the pressed-together position shown in FIG. 4B, the top molding portion 440 and the bottom molding portion 450 form the top and bottom molding portions 440 and 450.

Because the semiconductor package assembly 430 includes holes in the bottom molding portion 450, the bottom mold member 470 is configured to produce those holes during the injection molding process. Further details about the bottom mold member 470 are described with respect to FIGS. 5A and 5B.

Figure 5A:
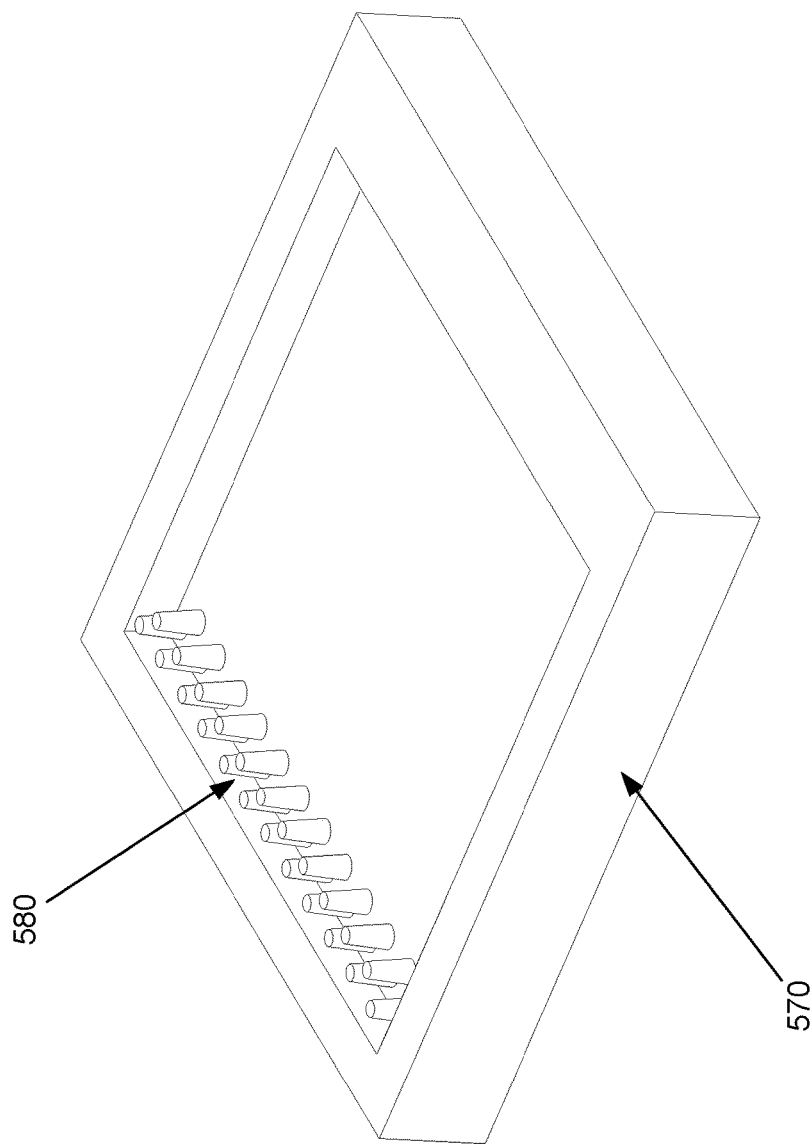
FIG. 5A is a diagram that illustrates an example bottom mold member having tapered pillars for creating the tapered holes in fluid communication with the openings.

FIG. 5A is a diagram that illustrates an example bottom mold member 570 for use in making a semiconductor package assembly as described above. As shown in FIG. 5A, the bottom mold member 570 has tapered pillars 580 for creating tapered holes in fluid communication with the openings of the socket members of the leadframe in the semiconductor package assembly (e.g., the semiconductor package assembly 400 shown in FIGS. 4A and 4B).

As shown in FIG. 5A, the pillars 580 have a circular cross-section. As noted above with regard to FIGS. 1B and 3C, the holes in the bottom molding portion 470 may have a cross-section different than a circular cross-section. The cross-sections of the pillars 580 can have a shape that matches the targeted shape of the cross-sections of the holes. For example, square holes can be made using square pillars, rectangular holes should be made using rectangular pillars, and so on.

Figure 5B:
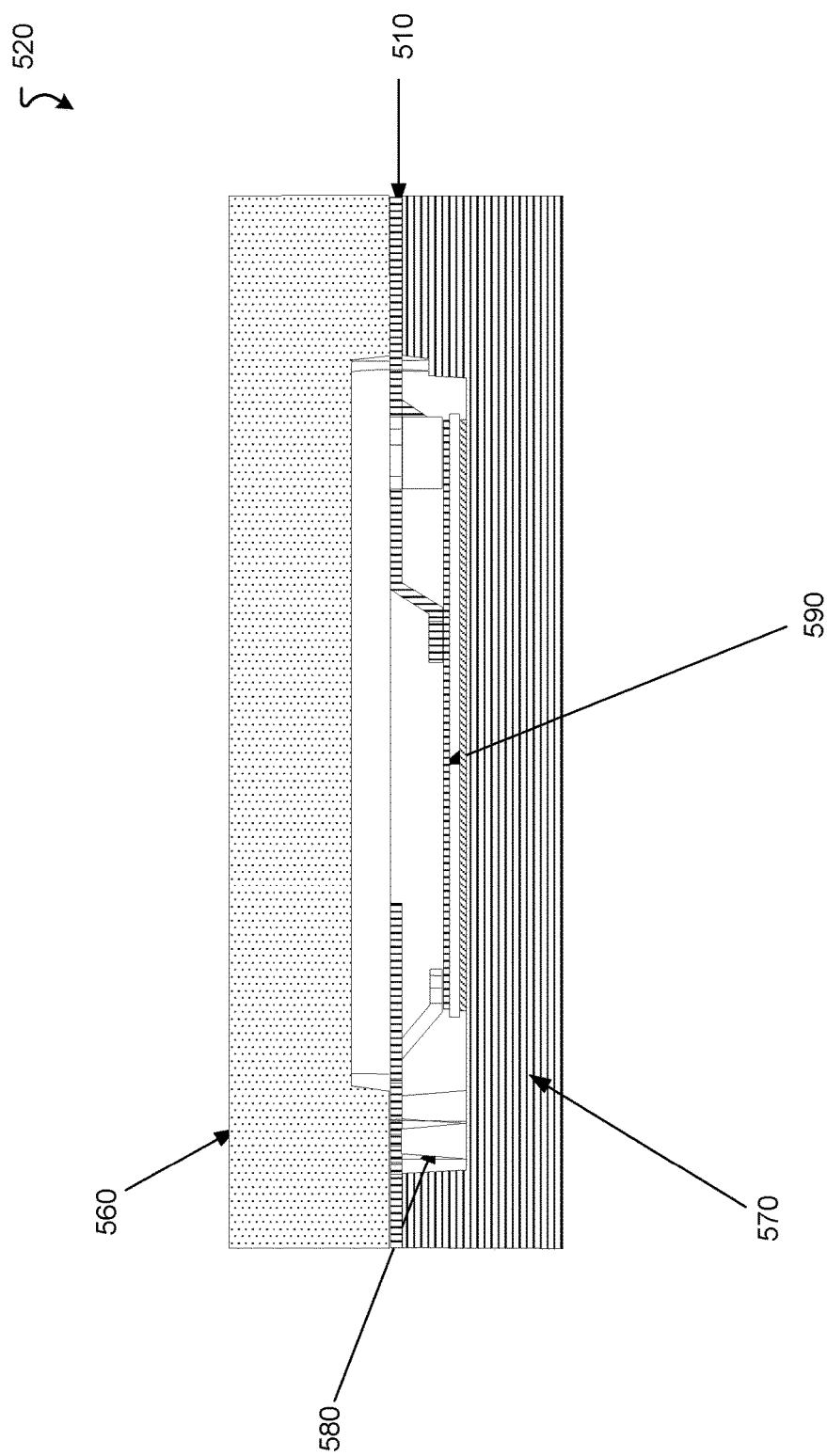
FIG. 5B is a diagram that illustrates example pressed-together top and bottom mold members that are configured to produce the tapered holes using an injection molding process.

FIG. 5B is a diagram that illustrates example pressed-together top and bottom mold members 560 and 570, respectively. As shown in FIG. 5B, the top and bottom mold members 560 and 570 are configured to produce tapered holes (e.g., the tapered holes 310 shown in FIG. 3) using an injection molding process FIG. 5B also shows the formation of a substrate 590 shown in FIG. 1C, using the bottom mold member 570. In this formation, the substrate 590 is placed in the bottom mold member 560 and is connected to the leadframe 510 prior to injection molding. A semiconductor component (e.g., the component 120 shown in FIG. 1A) may be placed on the substrate and bond wires connected between the semiconductor component 120 and the bond area of a socket member. Once all semiconductor components have been connected to socket members of the leadframe 510, the injection molding process may commence to create the top and bottom molding portions 540 and 550.

Figure 6:
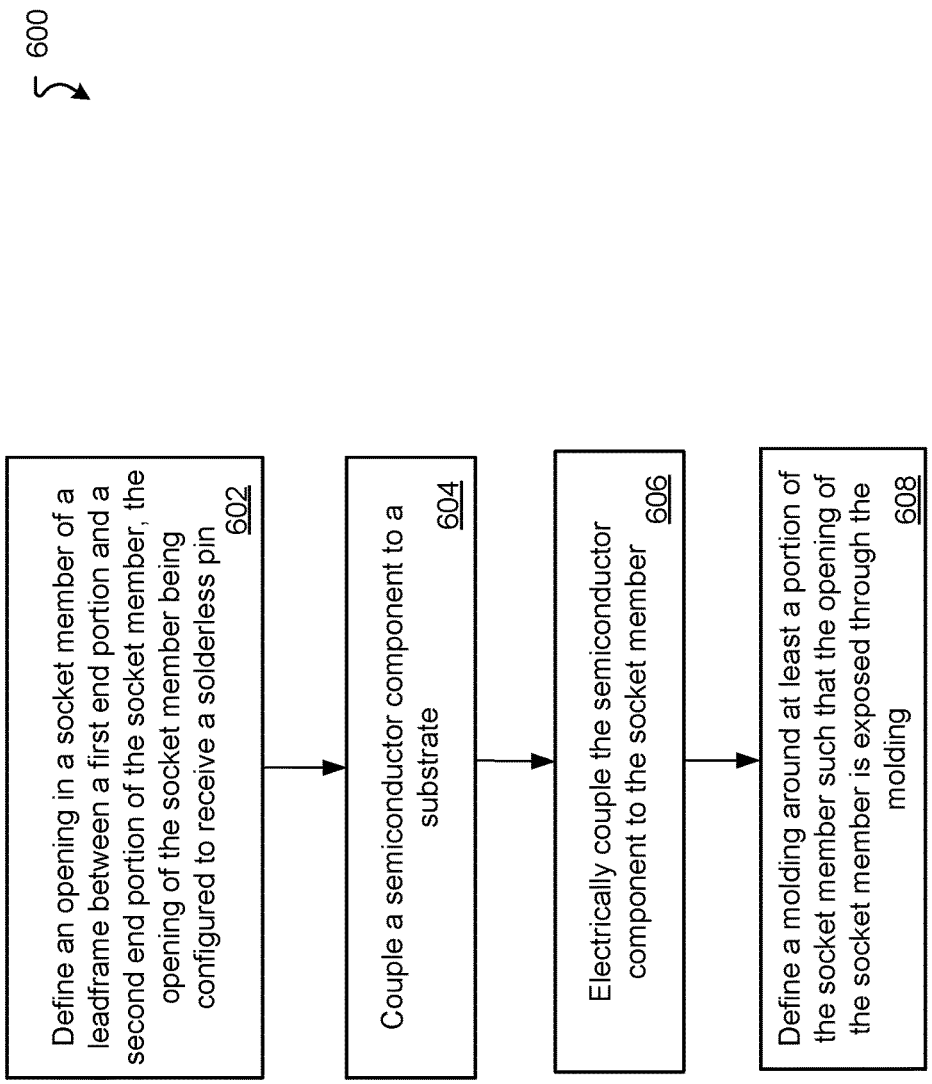
FIG. 6 is a flow chart that illustrates an example method of forming a package assembly with a leadframe having socket members with openings.

FIG. 6 is a flow chart that illustrates an example method 600 of forming a package assembly with a leadframe having socket members with openings.

At 602, an opening is defined in a socket member of a leadframe between a first end portion and a second end portion of the socket member. The opening of the socket member is configured to receive a solderless pin. For example, the socket member 130 shown in FIG. 1A has a first end portion 134 and a second end portion 136. One may define the opening 132 of the socket member 130 when the leadframe 110 is made using a single stamping process.

At 604, a semiconductor component is coupled to a substrate. For example, the semiconductor component 120 shown in FIG. 1C is mounted to the substrate 190.

At 606, the semiconductor component is electrically coupled to the socket member. For example, FIG. 1A shows the semiconductor component 120 being electrically connected to the bond area 138 of the socket member 130. The electrical connection is provided using the interconnect 122.

At 608, a molding is defined around at least a portion of the socket member such that the opening of the socket member is exposed through the molding. For example, FIG. 2A shows the portion of the socket members 230 that include the openings 232 are disposed within the recessed area 252 of a bottom molding portion 250, outside of a top molding portion 240. The leadframe 110 may then be removed.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method, comprising:
coupling a semiconductor component to a leadframe, the leadframe including a socket member having a first end portion and a second end portion, the socket member further including an opening disposed between the first end portion and the second end portion, the opening of the socket member being configured to receive a solderless pin; and
encapsulating, in a molding compound, at least a portion of the leadframe and at least a portion of the semiconductor component such that the opening of the socket member is exposed through the molding compound.

2. The method of claim 1, wherein the socket member is configured to define at least a portion of an electrical connection between the semiconductor component and an external component.

3. The method of claim 1, wherein:
the leadframe is disposed within a plane;
the molding compound includes a top molding portion disposed above the plane and a bottom molding portion disposed below the plane; and
the second end portion of the socket member is disposed between the top molding portion and the bottom molding portion.

4. The method of claim 1, wherein:
the molding compound includes a top molding portion and a bottom molding portion; and
the encapsulating includes forming the molding compound such that an edge of the top molding portion is offset from an edge of the bottom molding portion, such that a recessed area is defined.

5. The method of claim 4, wherein the socket member is exposed through the bottom molding portion in the recessed area.

6. The method of claim 1, wherein the semiconductor component includes a semiconductor die that is coupled to the leadframe.

7. The method of claim 1, wherein the semiconductor component includes:
a substrate coupled to the leadframe; and
a semiconductor die disposed on the substrate.

8. The method of claim 1, further comprising press fitting the solderless pin in the opening of the socket member, the solderless pin define at least a portion of an electrical connection between the semiconductor component and an external component.

9. The method of claim 1, further comprising forming an opening in the molding compound, the opening of the socket member being in fluid communication with the opening in the molding compound, the opening in the molding compound having an axis of symmetry, the opening in the socket member having a same axis of symmetry as the opening in the molding compound.

10. The method of claim 9, wherein the opening in the molding compound is one of a hole extending through the molding compound, or a cavity in the molding compound.

11. A method comprising:
electrically coupling a semiconductor component to a bond pad of a leadframe,
the leadframe including a socket member having a first end portion, a second end portion, and an opening disposed between the first end portion and the second end portion,
the bond pad being disposed on the second end portion of the socket member, the bond pad being aligned along a same plane as the socket member; and
encapsulating at least a portion of the leadframe and the semiconductor component in a bottom molding portion and a top molding portion, the top molding portion having an edge offset from an edge of the bottom molding portion such that a recessed area is defined, the opening of the socket member being exposed within the recessed area.

12. The method of claim 11, wherein the opening is configured to receive a solderless pin, the method further comprising, press-fitting the solderless pin into the opening.

13. The method of claim 11, further comprising forming an opening in the bottom molding portion, the opening of the socket member being in fluid communication with the opening in the bottom molding portion, the opening in the bottom molding portion having an axis of symmetry, the opening in the socket member having a same axis of symmetry as the opening in the bottom molding portion.

14. The method of claim 13, wherein the opening in the bottom molding portion is configured to conform to a shape of a solderless pin inserted through the opening of the socket member.

15. The method of claim 13, wherein a wall of the opening in the bottom molding portion is sloped, such that a diameter of the opening in the bottom molding portion at a bottom of opening in the bottom molding portion is larger than a diameter of the opening in the socket member.

16. The method of claim 11, wherein:
the leadframe is disposed within a plane;
the top molding portion is disposed above the plane;
the bottom molding portion disposed below the plane; and
the second end portion of the socket member is disposed between the top molding portion and the bottom molding portion.

17. A method comprising:
enclosing a leadframe having a semiconductor component coupled thereto in a molding cavity defined by a first mold member and a second mold member,
the leadframe including a socket member having a first end portion, a second end portion, and an opening disposed between the first end portion and the second end portion; and
injecting a molding compound into the molding cavity to encapsulate at least a portion of the leadframe and the semiconductor component in a bottom molding portion and a top molding portion, the top molding portion having an edge offset from an edge of the bottom molding portion such that a recessed area is defined, the opening of the socket member being exposed within the recessed area.

18. The method of claim 17, further comprising forming an opening in the bottom molding portion, the opening of the socket member being in fluid communication with the opening in the bottom molding portion, the opening in the bottom molding portion having an axis of symmetry, the opening in the socket member having a same axis of symmetry as the opening in the bottom molding portion.

19. The method of claim 18, further comprising press-fitting a solderless pin in the opening in the socket member and the opening in the bottom molding portion.

20. The method of claim 18, wherein forming the opening in the bottom molding portion includes forming one of a hole extending through the bottom molding portion, or a cavity in the bottom molding portion.

* * * * *